(12) United States Patent
Koulikov et al.

(10) Patent No.: US 6,792,010 B2
(45) Date of Patent: Sep. 14, 2004

(54) LASER WITH REDUCED PARASITIC ETALON EFFECTS

(75) Inventors: Serguei Koulikov, Sunnyvale, CA (US); Grzegorz Pakulski, Woodlawn (CA); Barbara A. Paldus, Sunnyvale, CA (US); Chris W. Rella, Sunnyvale, CA (US); Jinchun Xie, Cupertino, CA (US)

(73) Assignee: Picarro, Inc., Sunnyvale, CA (US)

(*) Notice: Subject to any disclaimer, the term of this patent is extended or adjusted under 35 U.S.C. 154(b) by 0 days.

(21) Appl. No.: 10/327,576

(22) Filed: Dec. 20, 2002

(65) Prior Publication Data

US 2004/0120364 A1 Jun. 24, 2004

(51) Int. Cl.[7] .............................. H01S 3/098
(52) U.S. Cl. .................. 372/19; 372/20; 372/32; 372/45; 372/64; 372/81; 372/102
(58) Field of Search .............. 372/19, 20, 32, 372/45, 64, 81, 102

(56) References Cited

U.S. PATENT DOCUMENTS

| | | | | |
|---|---|---|---|---|
| 5,305,087 A | * | 4/1994 | Bernard et al. | 356/461 |
| 6,263,002 B1 | * | 7/2001 | Hsu et al. | 372/6 |
| 6,488,419 B2 | * | 12/2002 | Kato et al. | 385/93 |
| 6,507,593 B1 | * | 1/2003 | Spinelli et al. | 372/20 |
| 2002/0018611 A1 | * | 2/2002 | Maleki et al. | 385/15 |
| 2002/0018627 A1 | * | 2/2002 | Kato et al. | 385/93 |
| 2002/0071463 A1 | * | 6/2002 | Gamache et al. | 372/45 |
| 2002/0075912 A1 | * | 6/2002 | Ito et al. | 372/32 |
| 2002/0163942 A1 | * | 11/2002 | Baillargeon et al. | 372/20 |
| 2002/0163952 A1 | * | 11/2002 | Hwang et al. | 372/96 |
| 2003/0016706 A1 | * | 1/2003 | Flint et al. | 372/20 |
| 2003/0043866 A1 | * | 3/2003 | Baillargeon et al. | 372/32 |
| 2003/0053511 A1 | * | 3/2003 | Baillargeon et al. | 372/97 |
| 2003/0053512 A1 | * | 3/2003 | Baillargeon et al. | 372/99 |
| 2003/0076866 A1 | * | 4/2003 | Baillargeon et al. | 372/99 |

* cited by examiner

*Primary Examiner*—Leon Scott, Jr.
(74) *Attorney, Agent, or Firm*—Herbert Burkard (57) ABSTRACT

According to the present invention, laser performance is improved by appropriately matching the spectral periods of various etalons within the laser cavity. A first embodiment of the invention is a discretely tunable external cavity semiconductor laser where a grid fixing etalon is present in the laser cavity, the grid fixing etalon free spectral range (FSR) is a whole number multiple of the laser cavity FSR, and the grid fixing etalon FSR is a whole number multiple of the chip etalon FSR. A second embodiment of the invention is a fixed wavelength external cavity semiconductor laser where the chip etalon FSR is a whole number multiple of the laser cavity FSR, and a mode suppressing etalon is inserted into the laser cavity such that the mode suppressing etalon FSR is a whole number multiple of the chip etalon FSR. A third embodiment of the invention is a tunable external cavity semiconductor laser where the chip etalon FSR is a whole number multiple of the laser cavity FSR. A fourth embodiment of the invention is a fixed wavelength external cavity semiconductor laser where the chip etalon FSR is a whole number multiple of the laser cavity FSR.

17 Claims, 7 Drawing Sheets fig 2 fig 3

LASER WITH REDUCED PARASITIC ETALON EFFECTS

FIELD OF THE INVENTION

This invention relates to lasers.

BACKGROUND OF THE INVENTION

A laser consists of a pumped gain medium situated within an optical resonator. The pumped gain medium provides light amplification, and the optical resonator provides optical feedback, such that light circulates within the optical resonator along a beam path and is repeatedly amplified by the gain medium. The optical resonator (or laser cavity) may be either a ring cavity or a standing-wave cavity. The laser cavity defines a set of longitudinal cavity modes, evenly spaced by a frequency interval referred to as the laser cavity free spectral range (FSR). Laser emission generally occurs at one or more of the longitudinal mode wavelengths. Optical pumping and electrical pumping by current injection are two known methods for pumping the gain medium. The emitted light may or may not be in the visible part of the electromagnetic spectrum.

One of the elements within the optical resonator acts as the output coupler, whereby a certain fraction of the circulating light is emitted from the optical resonator to provide the useful laser output. A partially transmitting mirror is a known output coupler. For semiconductor lasers, the output coupler is typically an end face of a semiconductor gain medium, which may be coated to provide a degree of reflectivity which optimizes performance. Semiconductor gain media typically include an epitaxially grown multilayer structure, and are classified according to the propagation direction of the emitted light. A gain medium is a surface emitter if the emitted light propagates perpendicular to the plane of the layers. A gain medium is an edge emitter if the emitted light propagates in the plane of the layers. Edge emitting semiconductor gain media typically include a single mode optical waveguide.

In order to provide tunability for a laser, or to select a specific emission wavelength of a laser, it is sometimes desirable to employ an external cavity geometry, where the laser cavity includes one or more optical elements which are spaced apart from the gain medium. The use of an external cavity for a tunable semiconductor laser allows the use of tuning elements which are difficult to fabricate in a monolithic semiconductor structure. Likewise, the use of an external cavity for a fixed wavelength semiconductor laser allows the use of wavelength selection elements which are difficult to fabricate in a monolithic semiconductor structure. For both tunable and fixed wavelength semiconductor lasers, the flexibility provided by an external cavity configuration generally provides improved optical performance (e.g. high side mode suppression ratio and improved wavelength accuracy) relative to a monolithic semiconductor laser.

In order to realize improved optical performance from an external cavity semiconductor laser, the effect of the parasitic etalon formed by the two end faces of a semiconductor gain medium must be suppressed. An intracavity etalon formed by two reflecting surfaces within a laser cavity is regarded as a parasitic if the etalon degrades laser performance. Known methods for suppressing the effect of the parasitic chip etalon include depositing anti-reflection (AR) coatings on one or both end faces of the gain chip, and orienting the gain element waveguide so that it intersects the chip end face at other than a right angle. These two methods are frequently employed simultaneously. However, even in such cases, the parasitic chip etalon frequently has an undesirable effect on laser performance.

It is therefore an object of the present invention to provide apparatus and method for reducing the deleterious effects on laser performance of parasitic etalons within an external cavity laser.

SUMMARY OF THE INVENTION

According to the present invention, laser performance is improved by appropriately matching the spectral periods of various etalons within the laser cavity. The frequency spacing between adjacent transmission peaks of an etalon is the free spectral range (FSR) of the etalon. A first embodiment of the invention is a discretely tunable external cavity semiconductor laser where a grid fixing etalon is present in the laser cavity, the grid fixing etalon FSR is a whole number multiple of the laser cavity FSR, and the grid fixing etalon FSR is a whole number multiple of the chip etalon FSR. A second embodiment of the invention is a fixed wavelength external cavity semiconductor laser where the chip etalon FSR is a whole number multiple of the laser cavity FSR, and a mode suppressing etalon is inserted into the laser cavity such that the mode suppressing etalon FSR is a whole number multiple of the chip etalon FSR. A third embodiment of the invention is a tunable external cavity semiconductor laser where the chip etalon FSR is a whole number multiple of the laser cavity FSR. A fourth embodiment of the invention is a fixed wavelength external cavity semiconductor laser where the chip etalon FSR is a whole number multiple of the laser cavity FSR.

DETAILED DESCRIPTION OF THE DRAWINGS

Figure 1:
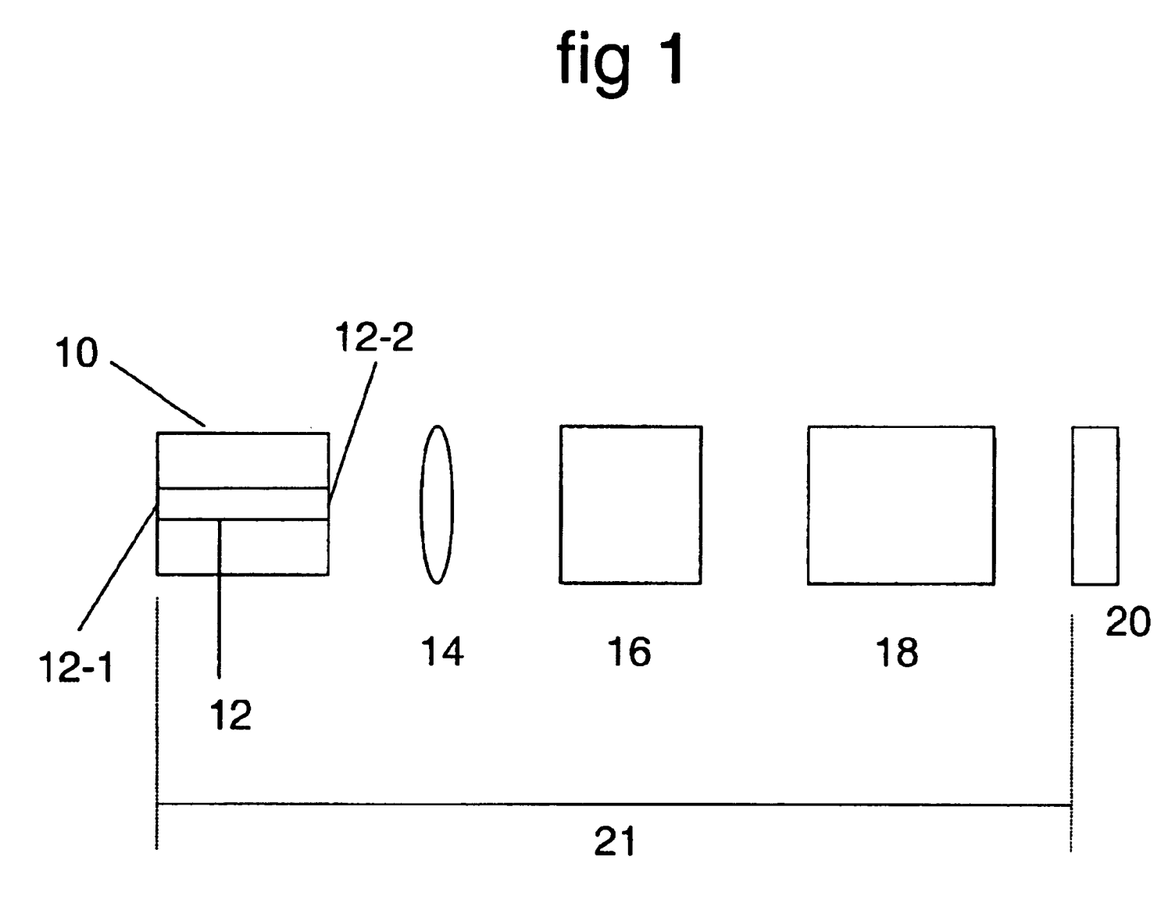
FIG. 1 schematically shows a first tunable laser embodiment of the invention.

FIG. 1 schematically shows a first tunable laser embodiment of the invention. It is convenient to start the discussion at output face 12-1 of semiconductor gain element 10 and follow a round trip within the laser cavity. Output face 12-1 is preferably coated to provide a low level of reflectivity which optimizes laser output power. Typical reflectivities for output face 12-1 are approximately in the range of 1–10 percent. Gain element 10 is preferably an electrically pumped semiconductor single or multiple quantum well structure which contains a single mode optical waveguide 12. Light reflected from output face 12-1 propagates through waveguide 12 of gain element 10 and is emitted from internal face 12-2 of gain element 10. Internal face 12-2 is typically anti-reflection (AR) coated to reduce the effect of the parasitic etalon formed by faces 12-1 and 12-2. In addition, the axis of waveguide 12 may be configured to intersect internal face 12-2 at an acute angle, which also tends to reduce the effect of the parasitic etalon formed by faces 12-1 and 12-2.

Optical radiation is emitted from internal face 12-2 of gain element 10 as a diverging beam which is received and collimated by lens 14. A lens which is suitable for this purpose is Geltech model 350140, which is an aspheric lens with 1.45 mm focal length, but other lenses with different focal lengths can be employed to practice the invention. The collimated beam propagates from lens 14 to grid fixing etalon 16.

Grid fixing etalon 16 introduces a high intracavity loss at all wavelengths except at its evenly spaced transmission peaks. Thus a laser according to FIG. 1 tunes discretely from roughly one grid fixing etalon transmission peak to the next, and does not tune to intermediate wavelengths. Discrete tunability is advantageous for applications where the laser is required to tune only to discrete channels equally spaced in frequency, such as dense wavelength division multiplexing (DWDM) applications. Excellent open loop wavelength accuracy can be obtained by aligning the laser channels as defined by the transmission peaks of grid fixing etalon 16 with the desired frequency grid during laser assembly, and measured open-loop deviations from the desired grid are typically less than 1 GHz over a tuning range of 5 THz or more.

In order to perform its intended function, grid fixing etalon 16 in FIG. 1 is preferably inserted into the laser cavity such that the etalon is tilted (i.e. its surface normals make a small angle, preferably 0.1–2 degrees, with respect to the cavity axis), to thereby ensure that beams reflected from the etalon surfaces do not efficiently couple into the laser cavity. The etalon finesse is moderate (e.g. 2< finesse <10), and this value of finesse is chosen to provide low loss in transmission through the tilted etalon, and the desired level of spectral selectivity. Because the etalon serves as an absolute wavelength reference for the laser, the etalon is preferably fabricated using materials, such as fused silica, that are mechanically stable and temperature insensitive. In addition, a longitudinal cavity mode (as defined by the laser resonator) wavelength should be present at or near each transmission peak of grid fixing etalon 16 that is within the desired tuning range. A preferred method for achieving this alignment of longitudinal modes to the transmission peaks of grid fixing etalon 16 is to design the laser so that the FSR of grid fixing etalon 16 is substantially a whole number multiple of (i.e. N times, where $N \geq 1$) the laser resonator FSR, and one of the transmission peaks of grid fixing etalon 16 within the desired tuning range is substantially aligned with a longitudinal mode defined by the laser resonator.

An additional advantage provided by grid fixing etalon 16 is that longitudinal cavity modes which are not aligned to its transmission peaks are suppressed. In particular, longitudinal cavity modes which are adjacent in wavelength to the emission wavelength are suppressed, which provides improved single mode laser performance (e.g. higher side mode suppression ratio and/or broader single-mode tuning range).

The beam emitted from grid fixing etalon 16 is received by tuning element 18. One tuning element which can be used to practice the invention is an acousto-optic tuning element as taught in U.S. patent application Ser. No. 10/086,283 entitled "Laser Tuning by Spectrally Dependent Spatial Filtering." Other tuning elements, including but not limited to, mechanically rotatable etalons, microelectromechanical (MEMS) etalons, liquid crystal tuning elements, diffraction gratings and birefringent Lyot filters can also be used to practice the invention.

The beam emitted from tuning element 18 is reflected by return mirror 20, and propagates back through tuning element 18, grid fixing etalon 16, lens 14 and waveguide 12 of gain element 10 in succession to complete a cavity round trip. Return mirror 20 typically has a reflectivity of at least 90%, and can be either a flat mirror or a curved mirror. Laser cavity 21 is defined by endface 12-1 of gain element 10 and return mirror 20. In some cases, the functions provided by return mirror 20 and tuning element 18 are performed by a single structure (e.g. a diffraction grating).

Figure 2:
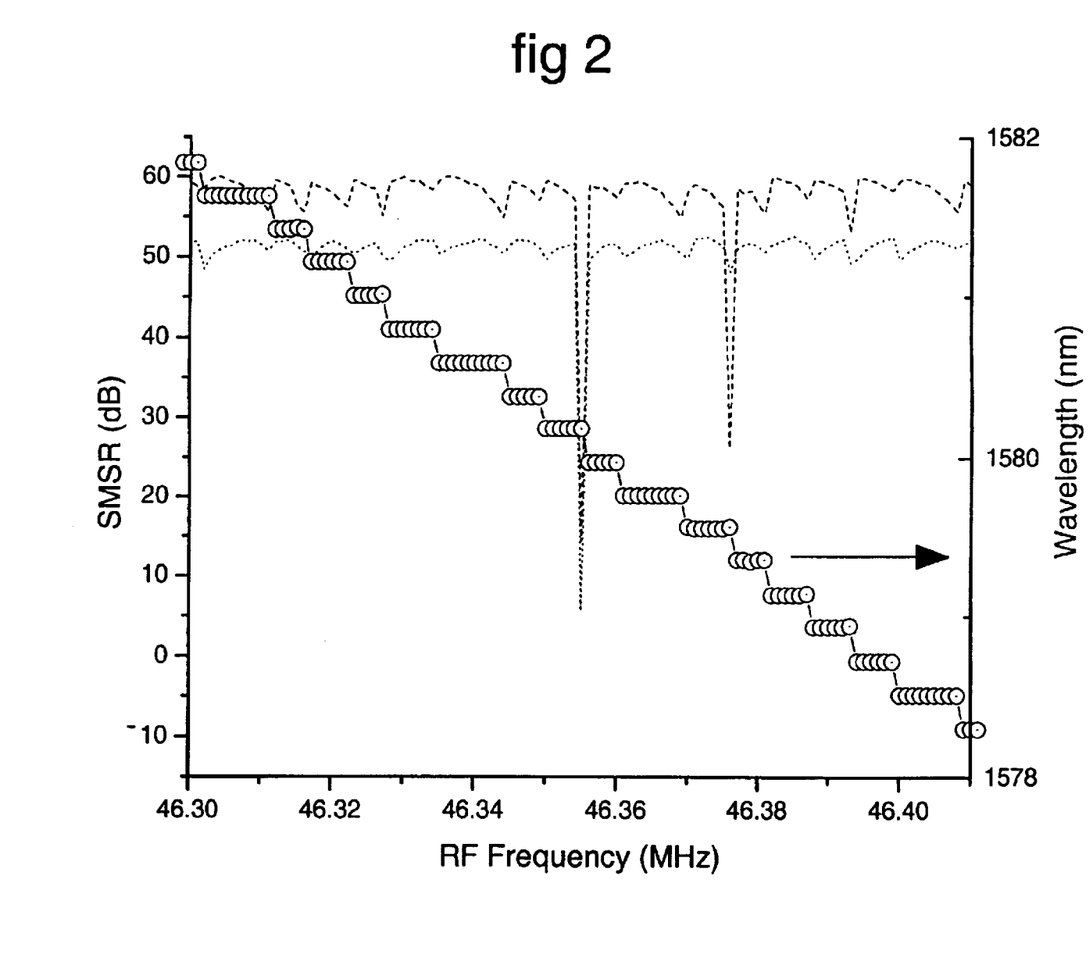
FIG. 2 graphically shows a measured power vs. wavelength curve for a discretely tunable external cavity semiconductor laser where the chip and grid fixing etalon FSRs are not matched in accordance with the present invention.

FIG. 2 shows measured side mode suppression ratio (SMSR) and output wavelength vs. RF frequency in the case of an acousto-optic tuning element 18, where the FSR of grid fixing etalon 16 is 25 GHz and the FSR of the parasitic etalon formed by end faces 12-1 and 12-2 of gain element 10 is 29 GHz. Two SMSR curves are plotted. The dotted line is the ratio of the power in the lasing mode to the power in the more intense of the two longitudinal modes adjacent in frequency to the lasing mode. The dashed line is the ratio of the power in the lasing mode to the power in the most intense side mode that is not adjacent in frequency to the lasing mode. Due to the presence of grid fixing etalon 16, which efficiently suppresses longitudinal cavity modes which are not aligned with its transmission peaks, the term "adjacent in frequency" used above means separated from the lasing mode by the FSR of the grid fixing etalon. The effect of grid fixing etalon 16 is clearly seen in the output wavelength plot, which shows that the laser tunes discretely from one wavelength channel to the next, and does not lase at intermediate wavelengths.

However, as also seen in FIG. 2, some channels are easier to access (i.e. the laser lases on a particular channel for a relatively broad RF frequency range), while other channels are harder to access (i.e. the laser lases on a particular channel for a relatively narrow RF frequency range). In other words, the "steps" shown on FIG. 2 have a significantly variable width. Steps that are unusually narrow are undesirable because the reduced tuning parameter range entails more stringent requirements on the control methods used to ensure stable, single-mode operation. In extreme cases, a channel may even be inaccessible.

The variable step width seen in FIG. 2 is attributed to a frequency dependent loss in the laser, where this frequency dependent loss is relatively low for channels which are easy to access, and relatively high for channels which are hard to access. The parasitic etalon formed by end faces 12-1 and 12-2 of gain medium 10 provides such an undesirable frequency dependent loss, and is commonly responsible for the undesirable variable step width behavior exemplified in FIG. 2.

The results of FIG. 2 are obtained from a laser where internal face 12-2 of gain element 10 is AR coated, and the axis of waveguide 12 makes an acute angle with respect to end face 12-2 of gain element 10. Although these two methods both tend to reduce the effect of the parasitic chip etalon, some undesirable effects remain. One approach for eliminating the effect of the parasitic chip etalon is to further reduce the back reflection provided by internal end face 12-2. However, an AR coated and tilted end face already provides a very low level of reflectivity (e.g. on the order of 0.0001 or less), so further reduction of the reflectivity tends to be difficult.

It is not necessary to eliminate the parasitic etalon completely (e.g. by reducing the reflectivity of end face 12-2 to a negligible level) in order to eliminate its effect on laser operation. Instead, it suffices to ensure the parasitic etalon provides the same loss at all channels defined by grid fixing etalon 16. This can be accomplished by setting the length of gain element 10 so that the FSR of grid fixing etalon 16 is a whole number multiple of the FSR of the parasitic etalon formed by end faces 12-1 and 12-2. When the FSR of the grid fixing etalon is matched to the FSR of the parasitic chip etalon in this manner, the parasitic etalon provides the same loss at all channels, and no longer tends to undesirably discriminate between channels. Exact FSR matching may not be required in practice, since a laser will only operate over a limited tuning range, and the variation of loss with wavelength is only relevant within the tuning range.

Figure 3:
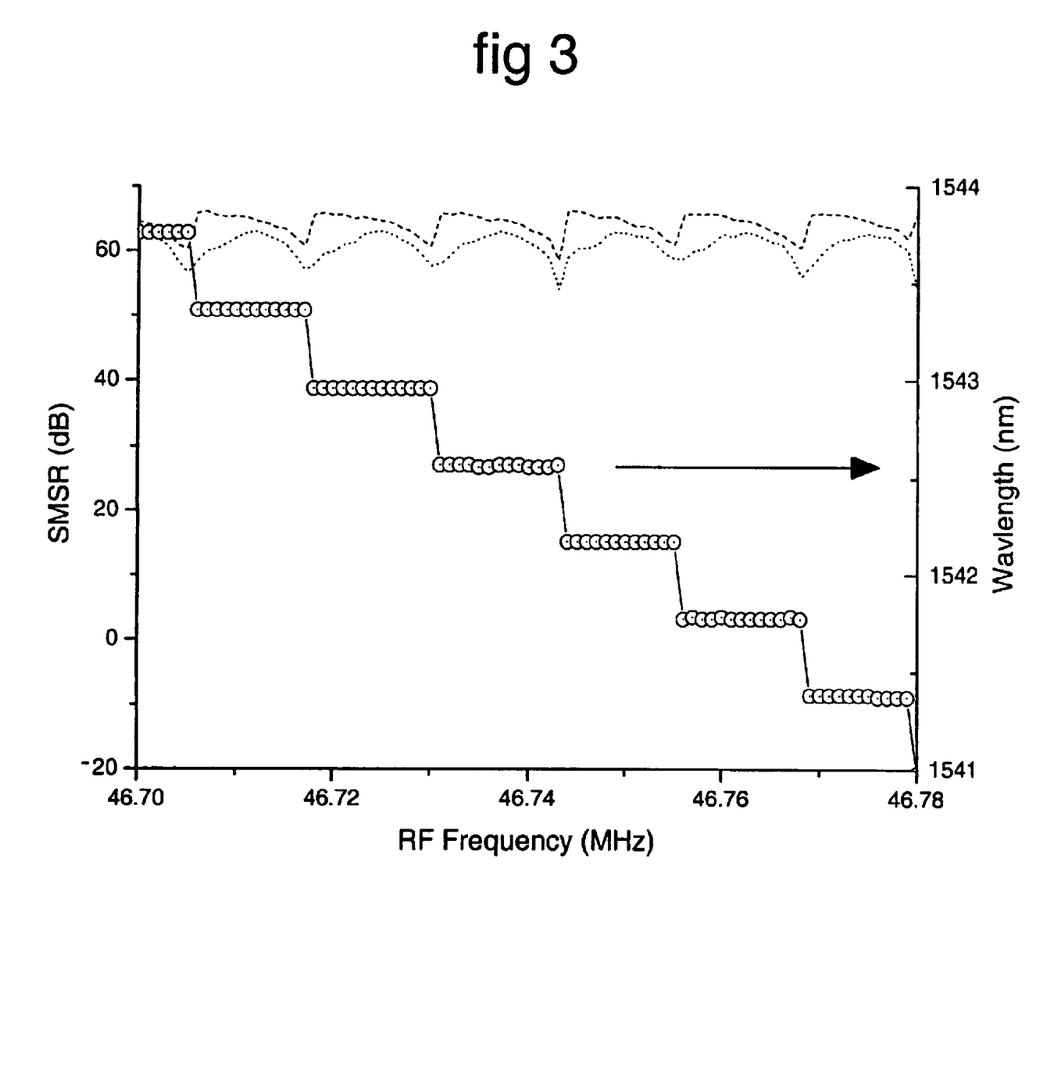
FIG. 3 graphically shows a measured power vs. wavelength curve for a discretely tunable external cavity semiconductor laser where the chip and grid fixing etalon FSRs are matched in accordance with the present invention.

FIG. 3 shows measured side mode suppression ratio (SMSR) and output wavelength vs. RF frequency applied to an acousto-optic tuning element 18, where the FSR of grid fixing etalon 16 is 50 GHz and the FSR of the parasitic etalon formed by end faces 12-1 and 12-2 of gain element 10 is 50 GHz. The SMSR curves on FIG. 3 are defined the same way as on FIG. 2. The steps in FIG. 3 do not vary significantly in width, and this desirable behavior is attributed to the matching of the FSR of grid fixing etalon 16 to the FSR of the parasitic chip etalon in this example.

The loss introduced by the parasitic etalon is typically low enough, because end face 12-2 is preferably AR coated and/or tilted, that it is unnecessary to align the spectral loss minima of the parasitic etalon with the transmission peaks of grid fixing etalon 16. In other words, the loss introduced by the parasitic etalon is normally only a problem if it varies from channel to channel. If it is desired to align the spectral loss minima of the parasitic etalon with the transmission peaks of grid fixing etalon 16, one method for doing so is to control the optical length (i.e. physical length times index of refraction) of the parasitic etalon.

Design features which improve the ability of a tunable laser (such as the laser of FIG. 1) to operate in a single mode are typically applicable to the design of a single-mode fixed-wavelength laser. Accordingly, a first fixed-wavelength embodiment of the invention, as schematically shown in FIG. 4, is the same as the configuration of FIG. 1, except that wavelength selector 22 on FIG. 4 is substituted for tuning element 18 on FIG. 1 and mode suppressing etalon 16' is substituted for grid fixing etalon 16.

One wavelength selector 22 which can be used to practice the invention is an interference filter positioned in the cavity such that only one of its transmission peaks is within the bandwidth of gain element 10, and this transmission peak is at the desired emission wavelength. Because tilting the interference filter changes the wavelength of maximum transmission, the emission wavelength of the laser can be selected during assembly. Other wavelength selectors, including but not limited to, diffraction gratings and etalons, can also be used to practice the invention. In some cases, the functions provided by return mirror 20 and wavelength selector 22 are performed by a single structure (e.g. a diffraction grating).

Figure 4:
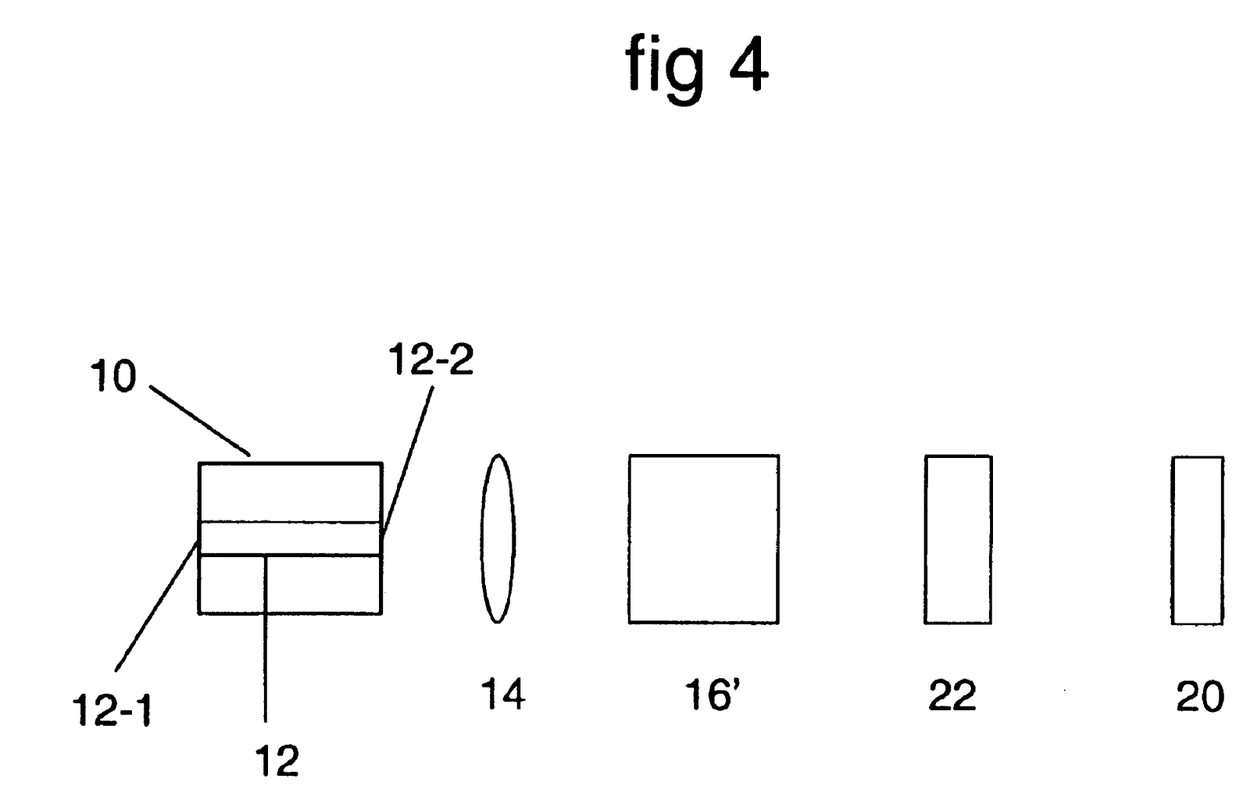
FIG. 4 schematically shows a first fixed-wavelength laser embodiment of the invention.

Because the laser of FIG. 4 is a fixed-wavelength laser, the transmission peaks of mode suppressing etalon 16' need not be aligned with a predetermined frequency grid. However, it is preferable for mode suppressing etalon 16' to satisfy the other constraints discussed above for grid fixing etalon 16 in FIG. 1.

The laser of FIG. 4 may be regarded as a tunable laser which is tuned only once (during assembly), so the discussion of FIGS. 2 and 3 is relevant to this embodiment. More specifically, the frequency dependent loss due to the parasitic etalon formed by end faces 12-1 and 12-2 of gain element 10 may make it more difficult to assemble the laser to operate at a desired wavelength, and/or may decrease the SMSR. As in the embodiment of FIG. 1, this problem can be solved by setting the length of gain element 10 so that the FSR of mode suppressing etalon 16' is a whole number multiple of the FSR of the parasitic etalon formed by end faces 12-1 and 12-2. When the FSR of the mode suppressing etalon is matched to the FSR of the parasitic chip etalon in this manner, the parasitic etalon provides the same loss at all wavelengths to which the laser can be set to during assembly, and no longer tends to undesirably discriminate between these wavelengths. Exact FSR matching may not be required in practice, since a laser will generally have a limited wavelength adjustment range, and the variation of loss with wavelength is only relevant within this adjustment range.

The loss introduced by the parasitic etalon is typically low enough, because end face 12-2 is preferably AR coated and/or tilted, that it is unnecessary to align the spectral loss minima of the parasitic etalon with the transmission peaks of mode suppressing etalon 16'. In other words, the loss introduced by the parasitic etalon is normally only a problem if it varies from wavelength to wavelength. If it is desired to align the spectral loss minima of the parasitic etalon with the transmission peaks of mode suppressing etalon 16', one method for doing so is to control and/or adjust the optical length of the parasitic etalon.

Figure 5:
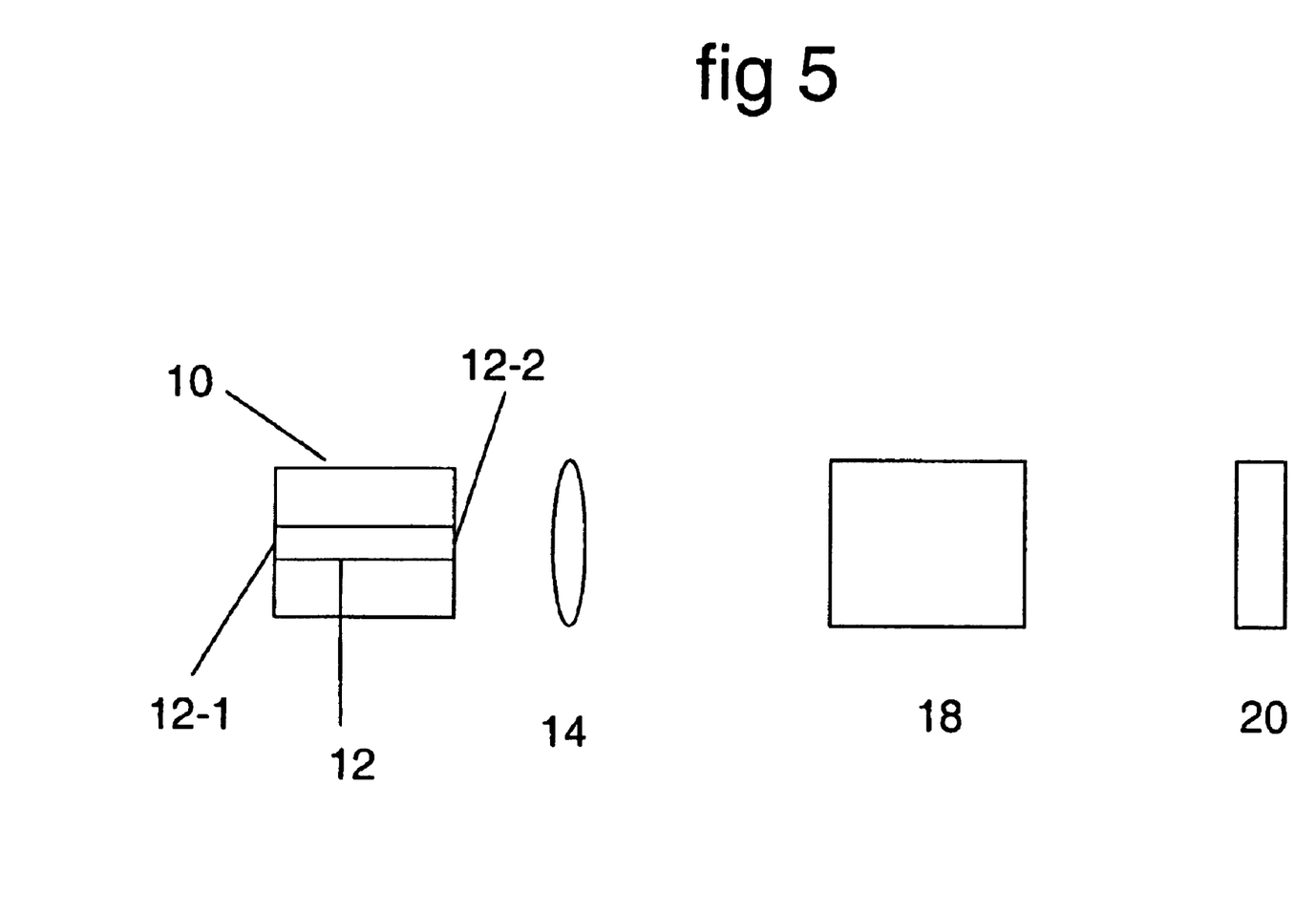
FIG. 5 schematically shows a second tunable laser embodiment of the invention.

A second tunable laser embodiment of the invention, as schematically shown on FIG. 5, is the same as the configuration of FIG. 1 except that grid fixing etalon 16 on FIG. 1 is not present on FIG. 5. For the laser of FIG. 5, it is advantageous to select the length of gain element 10 such that the FSR of the parasitic etalon formed by end faces 12-1 and 12-2 is a whole number multiple of the laser resonator FSR. For example, if the laser resonator FSR is 12.5 GHz, and the parasitic etalon FSR is 50 GHz, and the laser is tuned to channels which are 50 GHz apart, then the effect of the parasitic etalon is the same at all channels. As in the previous embodiments, the tendency of the parasitic etalon to undesirably discriminate among channels is eliminated by matching the FSR of the parasitic etalon to the FSR of the laser resonator.

Figure 6:
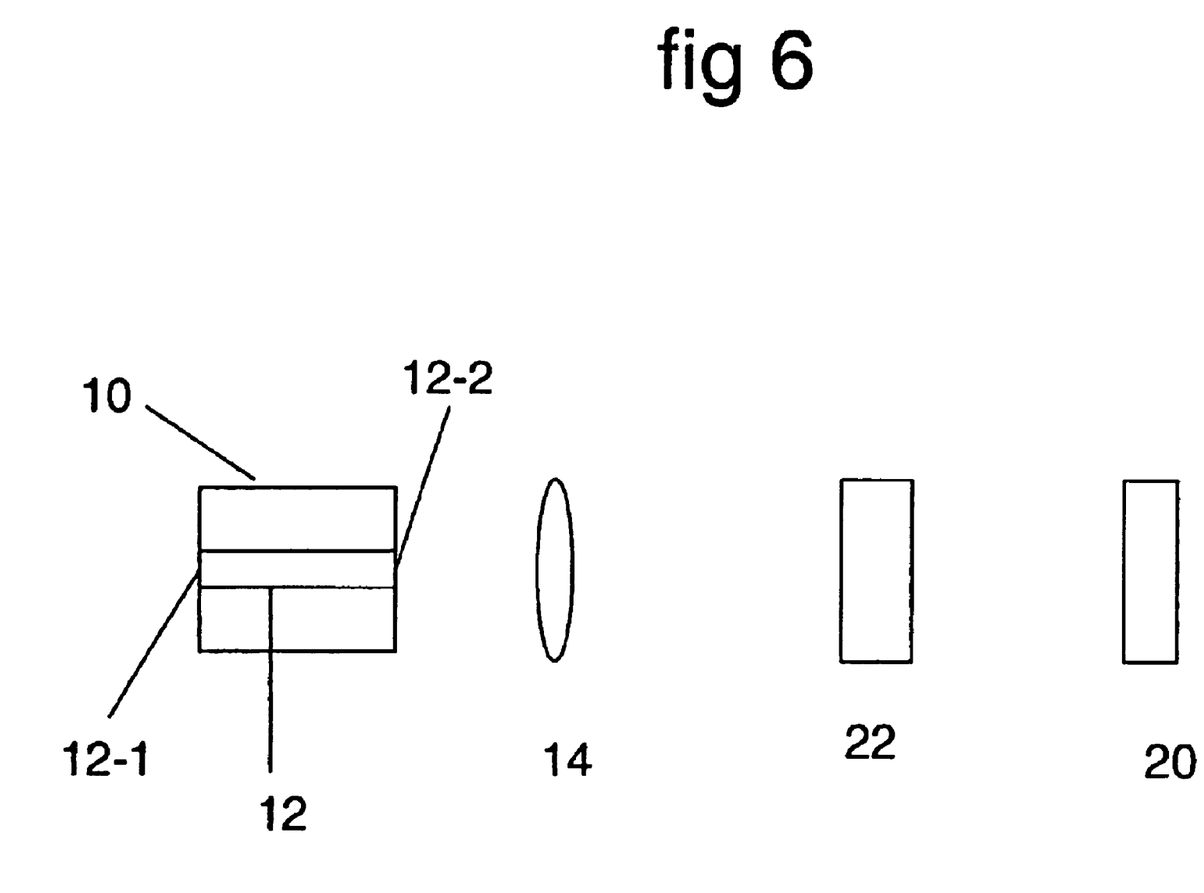
FIG. 6 schematically shows a second fixed-wavelength laser embodiment of the invention.

A second fixed-wavelength laser embodiment of the invention, as schematically shown on FIG. 6, is the same as the configuration of FIG. 3 except that mode suppressing etalon 16' on FIG. 3 is not present on FIG. 6. In this embodiment, the length of gain element 10 is chosen such that the FSR of the parasitic etalon formed by end faces 12-1 and 12-2 is a whole number multiple of the laser resonator FSR.

A common feature of the embodiments disclosed above is the matching of the FSR of the parasitic chip etalon to a "reference FSR". In some cases, such as the embodiments of FIGS. 5 and 6, the reference FSR is the FSR of the laser resonator. In other cases, such as the embodiments of FIGS. 1 and 4, the reference FSR is the FSR of an etalon contained within the laser resonator. Thus the reference FSR is equal either to a) the laser resonator FSR, or b) the FSR of an etalon present within the laser. The etalon in the laser cavity that defines the reference FSR in case (b) is not the parasitic etalon.

In the embodiments of FIGS. 5 and 6, the parasitic chip etalon FSR is a whole number multiple of the reference FSR, while in the embodiments of FIGS. 1 and 4, the reference FSR is a whole number multiple of the parasitic chip etalon FSR. We say A is integrally related to B if A is a whole number multiple of B or B is a whole number multiple of A. Therefore, the parasitic chip etalon FSR is integrally related to the reference FSR for all embodiments disclosed herein. Because a large difference between the chip FSR and the reference FSR can cause difficulty (e.g. a small resonator FSR requires a long resonator, which is usually more difficult to mechanically stabilize than a short resonator), the above whole number is preferably less than about 20, more preferably less than about 10.

Figure 7:
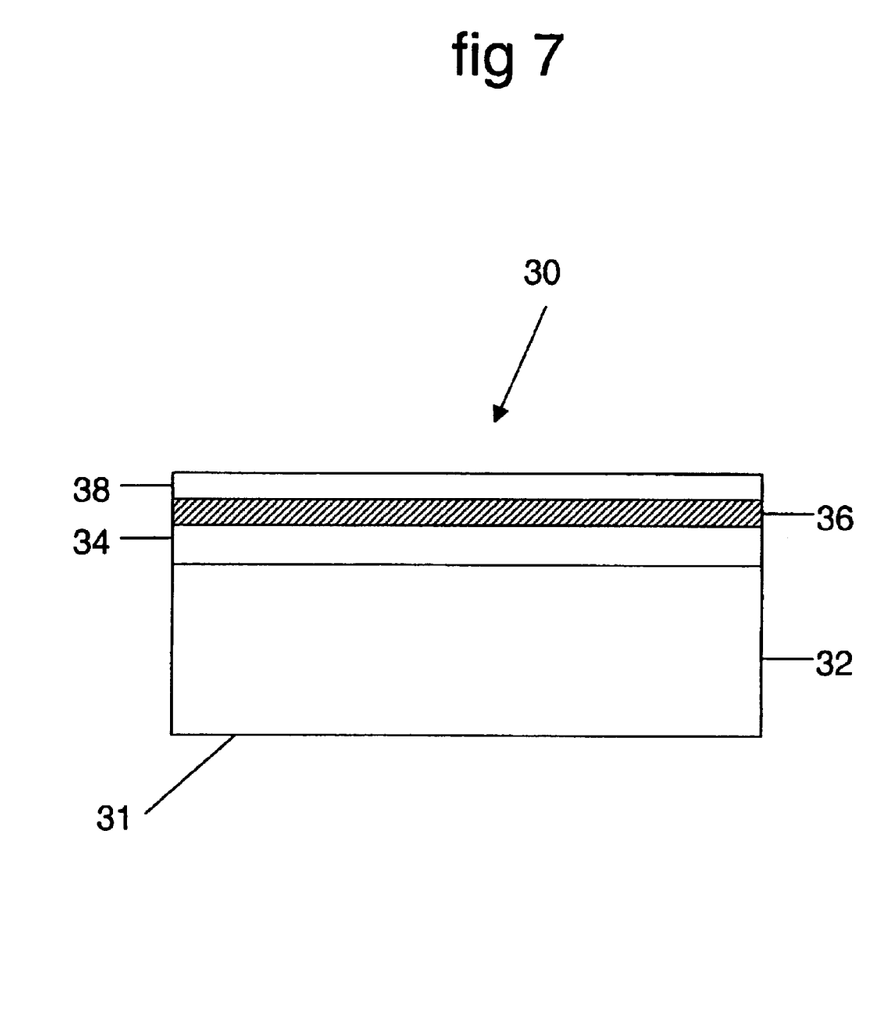
FIG. 7 schematically shows a surface emitting gain medium.

In the above embodiments, the semiconductor gain medium is an edge emitter. A surface emitting semiconductor gain medium may also be used to practice the invention. FIG. 7 schematically shows a surface emitting semiconductor gain medium 30. Optical gain is provided by active region 36, which is typically a multiple quantum well structure that can be optically or electrically pumped. Active region 36 is positioned between bottom region 34 and top region 38. Substrate 32 provides mechanical support to regions 34, 36, and 38. Regions 34 and 38 are multilayer semiconductor structures, while substrate 32 is typically a single semiconductor layer. The functionality provided by regions 34 and 38 depends on the desired surface emitting laser configuration. A vertical external cavity surface emitting laser (VECSEL) is obtained if bottom region 34 provides high reflectivity (e.g. region 34 is a quarter-wave mirror), top region 38 provides low reflectivity (or is absent), and a return mirror (analogous to return mirror 20 on FIG. 1) is located above top region 38. An alternative VECSEL is obtained if top region 38 provides high reflectivity, bottom region 34 provides low reflectivity (or is absent) and a return mirror is located below substrate 32.

In both of these VECSEL configurations, the parasitic etalon formed by the bottom surface (or interface) 31 of substrate 32 and the high reflectivity mirror (i.e. region 34 or region 38 depending on the configuration) has undesirable effects on laser performance. In VECSEL embodiments of the invention corresponding to FIGS. 1, 4, 5, and 6, matching the FSR of a parasitic etalon within the VECSEL gain medium to a reference FSR is advantageous. In these embodiments of the invention, provision of a collimating lens (e.g., 14 in FIG. 1) is not always necessary.

What is claimed is:

1. An external cavity laser comprising:
   a laser cavity having an associated first free spectral range (FSR);
   a semiconductor gain chip, located within the laser cavity, that provides a first etalon and that has an associated second FSR that is substantially a first whole number multiple of the first FSR; and
   a mode suppressing second etalon, located within the laser cavity, that has an associated third FSR that is substantially a second whole number multiple of the second FSR.

2. A laser in accordance with claim 1, further comprising a wavelength selector element associated with said laser cavity.

3. A laser in accordance with claim 2, wherein said wavelength selector comprises at least one of an interference filter and a diffraction grating.

4. A laser in accordance with claim 2, wherein said first whole number lies in a range of 1–20.

5. A laser in accordance with claim 1, further comprising a wavelength tuning element located within said cavity.

6. A laser in accordance with claim 1, wherein said gain element is selected from a group of gain elements consisting of an edge emitting gain medium and a surface emitting gain medium.

7. A laser in accordance with claim 1, wherein said first whole number multiple is no greater than 20.

8. A laser in accordance with claim 1, wherein said second whole number multiple lies in a range of 1–20.

9. A laser in accordance with claim 1, wherein said gain chip further comprises a multiple quantum well structure that is electrically pumped.

10. A discretely tunable external cavity laser comprising:
    a laser cavity having a cavity axis and having an associated first free spectral range (FSR);
    a semiconductor gain chip, located within the laser cavity, that provides a first etalon and has an associated second FSR; and
    a grid fixing second etalon, located within the laser cavity, that has a third associated FSR, where the third FSR is substantially a first whole number multiple N1 of the first FSR and is substantially a second whole number multiple N2 of the second FSR and N1 is different from N2.

11. A laser in accordance with claim 10, wherein said second etalon has at least two transmission peaks that are aligned to a selected frequency grid.

12. A laser in accordance with claim 10, wherein said gain element further comprises a multiple quantum well that is electrically pumped.

13. A laser in accordance with claim 10, wherein said gain element further comprises a single mode waveguide.

14. A laser in accordance with claim 10, wherein said gain element is selected from a group of gain elements consisting of an edge emitting gain medium and a surface emitting gain medium.

15. A laser in accordance with claim 10, further comprising a wavelength tuning element located within said laser cavity.

16. A laser in accordance with claim 10, wherein said first etalon is tilted at a selected non-zero angle with respect to said laser cavity axis.

17. A laser in accordance with claim 10, wherein said gain element further comprises at least one internal face that is anti-reflection coated.

* * * * *